United States Patent [19]

Hormel

[11] Patent Number: 5,363,405
[45] Date of Patent: Nov. 8, 1994

[54] VEHICLE COMMUNICATIONS NETWORK TRANSCEIVER, BUS DRIVER THEREFOR

[75] Inventor: Ronald F. Hormel, Clinton Township, Macomb County, Mich.

[73] Assignee: Chrysler Corporation, Highland Park, Mich.

[21] Appl. No.: 982,321

[22] Filed: Nov. 27, 1992

[51] Int. Cl.$^5$ .................... H04B 1/38; H03K 7/08; H03K 9/08
[52] U.S. Cl. .................... 375/7; 375/22; 340/825.63; 307/9.1; 329/312; 332/109
[58] Field of Search ............ 375/5, 22, 7, 36; 370/85.8, 85.2; 340/425.5, 825.08, 310 A, 825.57, 825.63; 329/312; 332/109; 307/9.1, 10.1; 341/53

[56] References Cited

U.S. PATENT DOCUMENTS 4,804,937  2/1989  Barbiaux et al. .................... 340/459
5,274,634  12/1993  Halter et al. ........................ 370/85.1

*Primary Examiner*—Tesfaldet Bocure
*Attorney, Agent, or Firm*—Wendell K. Fredericks

[57] ABSTRACT

A transceiver device for use with a microcontroller and a symbol encoder decoder device (forming a node in a communications network) for transmitting and receiving variable pulse width modulated (VPWM) analog signals containing symbol messages over a communications bus. The transceiver accepts digital VPWM signals from the symbol encoder decoder device which were generated by the microcontroller and converts the digital signals into VPWM analog signals and then transmits the analog signal over the bus to other nodes. The transceiver also receives VPWM analog signals placed on the bus by other nodes of the network and transfers the signals in digital form to the symbol encoder decoder device which, in turn, communicates the decoded messages to the microcontroller. The transceiver contains a ground translation circuit for transferring transmitted signals to an independent bus ground return before a bus driver circuit sources message signals in the form of pulse currents over the bus. The bus driver circuit contains circuits that permit arbitration to take place when more than one node attempts to transmit over the bus. The receiver circuit also contains ground translation circuits for translating bus signals from the bus ground return to a signal ground return.

12 Claims, 3 Drawing Sheets

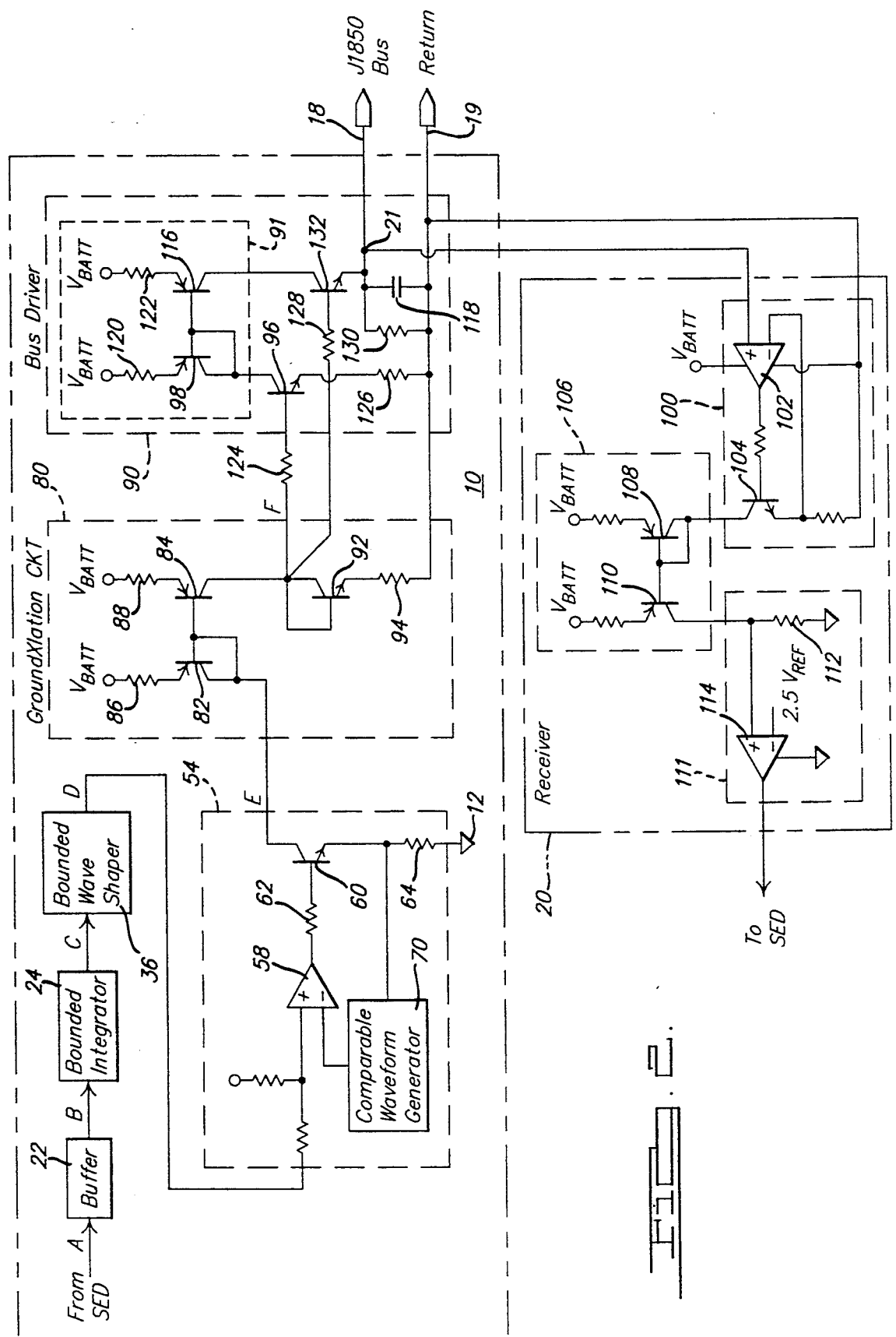

VEHICLE COMMUNICATIONS NETWORK TRANSCEIVER, BUS DRIVER THEREFOR

BACKGROUND OF THE INVENTION

Due to the continual use of more and more electronics in vehicles, the Society of Automotive Engineers (SAE) encouraged the entire automotive industry to develop a standard data link, preferably a medium-speed (Class B) multiple access serial communications link. Already, SAE has established Recommended Practice J1850 (a set of technical requirements and parameters) and the industry has accepted a Class B data link as a J1850 as the recommended practice.

J1850 specifies use of symbols for communicating serial data over a communications bus. In variable pulse width modulation (VPWM) encoding, as used in the present invention, a symbol comprises a voltage logic level that extends for a period of time and then a voltage transition or edge.

The amount of time and the voltage level between trip points of the previous edge and the current edge defines the meaning of the symbol. For example, a logic zero bit which can be either a short low of 64 µs or a long high of 128 µs represents the time between edges or transitions of the VPWM signal. J1850 specifies 3.875 volts as a nominal receiver trip point voltage parameter.

To minimize EMC problems during each transition of waveforms containing symbol information, waveshaping of the VPWM edges must take place. To satisfy RFI requirements of signals that reach the bus, each edge must have a certain slope and corner shape.

Within a transceiver, problems result in trying to maintain consistent transmitted trip points. Since the trip point of the previous edge provides the point of reference for the current edge, a problem occurs if the trip points of the transitions occur at different times.

J1850 specifies that communication busses may be a single wires routed throughout the network.

In prior systems, reshaping VPWM pulses to satisfy RFI requirements occur, but usually without considering maintaining consistent transmitted pulse trip-points. Probably the prior system designers focus more attention to problems of voltage offset between nodes rather than transmitting clean pulses.

In prior systems, to address noise spikes on the bus, designers have incorporated filtering schemes. Usually, filters used with line drivers help in eliminating short duration noise spikes and transition noise from incoming waveforms. But, such arrangements cause delays in transition time of the pulses.

In prior single wire bus systems, symbol pulse widths have not been affected by multiple nodes trying to transmit at the same time during arbitration. This is because a single node effectively dominates each transition. It is the first node to leave the passive state or the last node to leave the active state. However, feed-back type approaches have been employed to maintain the integrity of voltage levels and the shape of pulses reshaped to combat EMI noise. Such systems tend to be prone to some oscillation and weakness with respect to dealing with pulse width distortion due to undesirable pulses on the single-wire bus.

In an effort to find a bus driver capable of transmitting symbol messages over a single wire bus with minimal distortion of symbol time spans, and with some immunity from undesirable noise spikes, a search took place to find bus driver arrangements which could control current and voltage changes, including spikes without destroying the integrity of the transmitted messages. This search resulted in the present invention which uses voltage levels of the inputed pulse signals to control current signals on the bus in a manner which maintains the integrity of the transmitted messages.

SUMMARY OF THE INVENTION

A transceiver in a multi-node communications network contains a ground translation circuit which transfers transmitted signal reference to a signal ground return to an independent bus ground return. The transceiver also contains a bus driver circuit which transmits signals if the bus voltage levels remain below a varying voltage reference contained in the bus translation circuit. The bus driver circuit also has a circuit which cuts off transmissions if the bus voltage level remains higher than the varying voltage reference in the bus translation circuit.

IN THE DRAWINGS

FIG. 2 depicts in schematic diagram form a portion of the transmitter circuit containing novel ground translation and bus driver circuits of this invention.

DETAILED DESCRIPTION OF A PREFERRED EMBODIMENT

Figure 1:
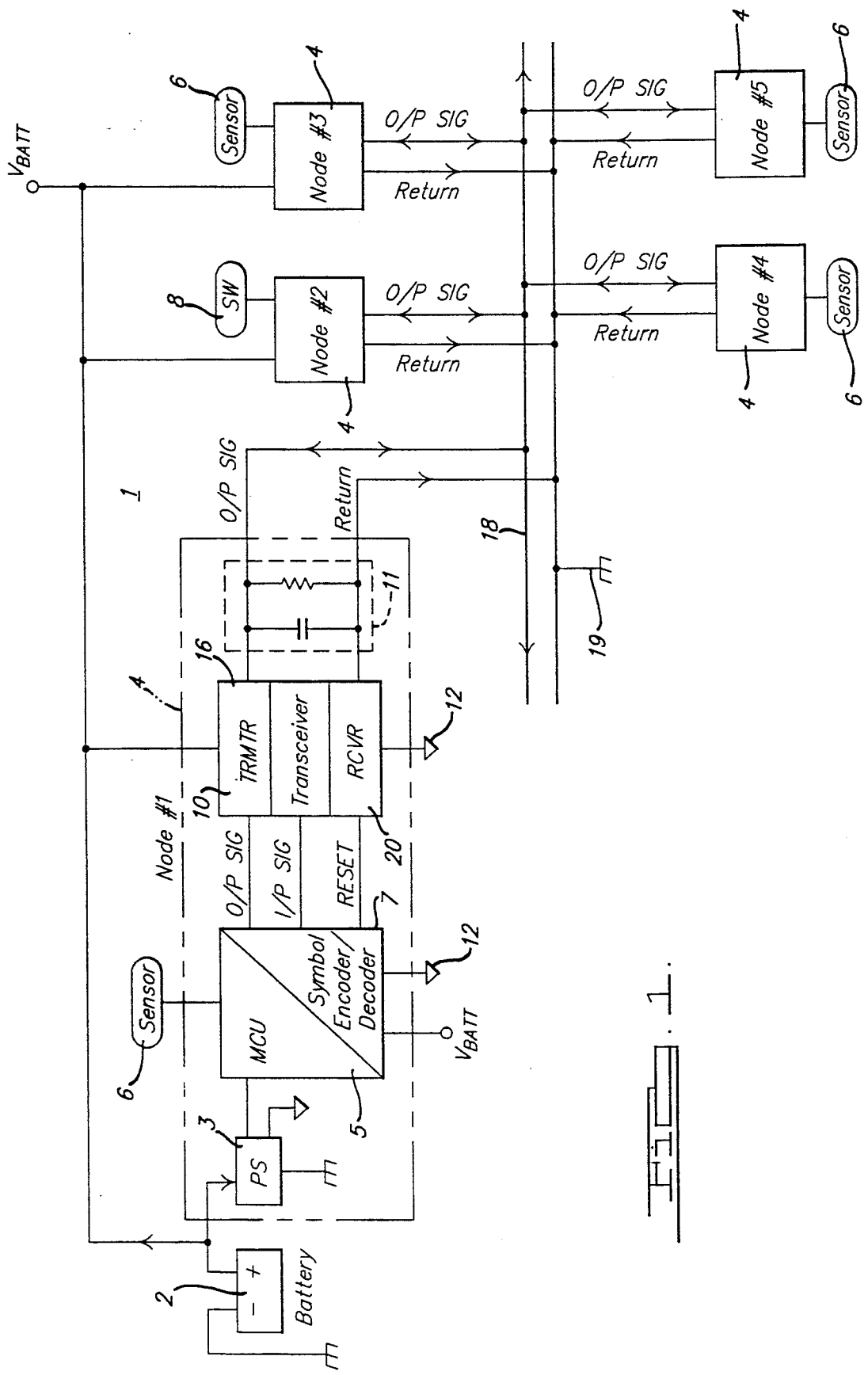
FIG. 1 illustrates in block diagram form a communications network employing a transmitter circuit of this invention in a transceiver.

FIG. 1 depicts a multiplexing network 1 that includes the novel bus driver scheme contained in a transceiver of the present invention. With the negative terminal grounded to the chassis of a vehicle, battery 2 supplies battery power ($+V_{batt}$) to the network nodes.

Each 5-volt DC regulated power supply 3 of nodes 4—4 receives $V_{batt}$ and provides at an output terminal suitable regulated 5 Vdc to a plurality of signal conditioning circuits. In addition to the regulated power source 3, each node 4 contains a microcontroller (MCU) 5, preferably an 8-bit, single-chip microcontroller, a suitable symbol encoder/decoder(SED) 7, a transceiver 10 and a termination network 11.

MCU 5 receives sensor or switch signals of measurands (which are common measured variables such as pressure, rate of flow, thickness, temperature, and speed, etc.) and then uses the signals to generate control signals for manipulating SED 7 to produce a plurality of message symbols in a suitable VPWM format. Transceiver 10, interfaced with bus 18 through a termination network 11, accepts the message symbols from SED 7. Transceiver 10 translates message symbols referenced with respect to a signal ground return to message symbols referenced with respect to a bus ground return. Then transceiver 10 transmits the messages over bus 18 in an analog VPWM format to other nodes 4—4.

Each transceiver 10 contains waveshaping and ground translation circuits. A separate ground return (signal ground return 12) relates to waveshaping circuits while an independent ground return 19 relates to ground translation circuits. The waveshaping circuits of the transceiver appear in a co-pending patent application of the present inventor and a co-inventor, Frederick Miesterfeld, Ser. No. 07/951,988, filed Sep. 28, 1992. The ground translation circuit of the transceiver appears in another co-pending patent application of the present inventor and a co-inventor, Frederick Miesterfeld, Ser. No. 07/951,989, filed Sep. 28, 1992.

Bus 18, unlike conventional single-wire buses, does not depend on a large number of turns of twisted wire or shielding material to minimize noise. Bus 18 routes throughout the small area network as an untwisted wire with untwisted wire extensions depending from each node. Noise control results from modifications of the VPWM signals received an the transmitting and receiving portion of transceiver 10.

Also in FIG. 1, the block diagrams portray several other nodes 4—4 employing the transceiver 10. The single-wire bus 18 routes to interconnect the other nodes 4—4. Transceiver 10 includes both transmitter (TRMTR) 16 and receiver (RCVR) 20 circuits. This invention discloses the bus drivers in TRMTR 16.

The Transceiver Circuits

With reference now to FIG. 2, this figure depicts in partial block diagram and schematic diagram form a transceiver 10 of the present invention. SED 7 of FIG. 1 produces a plurality of message symbols in a suitable VPWM square-wave format. The square wave signal enters buffer 22 at port A of FIG. 2 and then leaves through port B to enter bounded integrator 24.

BOUNDED INTEGRATOR

Integrator 24 inverts and integrates the square-wave signal and then produces at an output port C a symmetrical trapezoid type waveform signal. The trapezoid signal carries pulses having edges with lengthened rise and fall times, reduced amplitudes and established trigger-point voltages. The established trigger-point voltages maintain each symbol length equidistant with respect to the pulse width of the symbols expressed in the input square-wave waveform.

BOUNDED WAVESHAPER

Bounded waveshaper 36 receives the ,output signal from bounded integrator 24 at point C. Waveshaper 36 reshapes both pulse corners at the extremities of each edge over a chosen duration. Then it produces at port D another trapezoid waveform signal in phase with the input waveforms which includes pulses with increased curvature corners and increased amplitudes with respect to the trip-point voltage.

VOLTAGE-TO-CURRENT CONVERTER

The reshaped trapezoid waveform signal at point D enters voltage-to-current converter device 54 and gets transformed into a controlling voltage for the input loop of buffer transistor 60.

The voltage-to-current converter device 54 includes a operational amplifier (op-amp) 58 and transistor 60. The reshaped trapezoid waveform signal at port D applies to a non-inverting terminal of op-amp 58. Op-amp 58 performs a voltage difference measurement with respect to a comparable waveform generated from a feedback associated circuit 70 applied to an inverting terminal. The output of op-amp 58, an analog signal, gets amplified and applied to the base of transistor 60 through a base resistor 62 providing base current to the input loop of the transistor. Battery current from ground translation circuit 80 enters, through the collector terminal, the output loop of transistor 60. This output loop provides a programmed current-sink circuit used to sink current at port E routed from the ground translation circuit 80. Transistor 60 controls the amount of current-sinking between the collector and emitter terminals. Changes in the base voltage cause corresponding changes in the emitter voltage across the emitter resistor 64.

GROUND TRANSLATION CIRCUIT

Ground translation circuit 80, connected in this embodiment to raw battery power through resistors 86 and 88, reacts to controlled current signals of buffer transistor 60 in the voltage-to-current converter device 54 connected to one output of circuit 80. Ground translation circuit 80 uses a current mirror technique of matched base-emitter biasing of matched-pair dual PNP transistors 82 and 84 to produce a current source output which mirrors the controlled current signal. Transistor 82 of the matched pairs acts as a reference diode, with its base terminal, shorted to the collector terminal.

The current output path of referenced diode 82 routes to the collector of buffer transistor 60 of device 54 and returns to signal ground 12. When transistor 60 operates, it sinks the reference diode current to signal ground. This causes a Vbe of transistor 82 appropriate to that current at the circuit temperature and for that transistor type. Transistor 84 matched to transistor 82 thereby sources the same current to another transistor 92 connected as a reference diode. The emitter of transistor 92 returns current through an emitter resistor 94 to bus return 19, a return independent of signal ground 12.

With transistor 92 connected as the second reference diode, the voltage across resistor 94 is clamped at one diode drop below the voltage appearing at port F.

The pulse voltage across resistor 94 and independent ground 19, illustratively, of about 8.0 $V_{p-p}$, exhibits about 4 times the pulse voltage appearing across resistor 64 and signal ground 12. The PW of both pulses remain constant at, illustratively, 64 $\mu$s at the trip points regardless of the changes in ground potential in each node of the network. Hence, any voltage offsets of the signal and bus grounds in each node will not affect the symbol timing content of the messages transferred over the bus.

BUS DRIVER CIRCUIT

As mentioned supra, the voltage appearing at port F, about 4 times the pulse voltage across resistor 64 of device 54, provides base current to the input loop of transistor 96 through base resistor 124. Raw battery current flowing through emitter resistors 120 and 122 and to a current mirror circuit 91 of bus driver 90 enters the collector terminal in the output loop of transistor 96. This output loop provides a programmed current-sink circuit used to sink current from the reference diode circuit 98 of current mirror circuit 91. Transistor 96 controls the amount of current-sinking between the collector and emitter terminals. Changes in the base voltage cause corresponding changes in the emitter voltage across the emitter resistor 126.

A nearly identical current flowing through the reference diode 98 of current mirror 91 gets reflected into the output loop of transistor 116. When transistor 116 operates, it sources the reflected current to single wire bus 18.

The pulse voltage across resistor 126 and independent ground 19, illustratively, of about 8.0 $V_{p-p}$, also exhibits about 4 times the pulse voltage appearing across resistor 64 and signal ground 12. The PW of both pulses remain constant at, illustratively, 64 $\mu$s at the trip points regardless of the changes in ground potential in each node of the network. Hence, any voltage offsets of the signal and bus grounds in each node will not affect the symbol timing content of the messages transferred over the bus.

RECEIVER CIRCUIT

From bus 18 at node 21, bus current, referenced to bus return 19, and symbol information immediately route back to the input of receiver 20, an active load. There, another voltage-to-current converter circuit 100, including an operational amplifier 102 and a buffer transistor 104, controls the pulse current in an input circuit of another current mirror circuit 106.

Current mirror circuit 106 comprised of referenced diode 108 and output transistor 110 supplies programmed pulse current to load resistor 112 referenced now to signal ground 12 in an output circuit. Translation of signals from bus return 19 back to signal return 12 occurs in current mirror circuit 106. Comparator 114 compares the voltage across resistor 112 with a fixed referenced voltage. The output of comparator 114 provides digital pulse signals referenced with respect to signal ground to SED 7 of FIG. 2. SED 7 uses the digital signal to extract symbol information from the pulses.

OPERATION OF THE DRIVER CIRCUIT

During operation of bus driver 90, the varying trapezoidal waveforms at terminal F represent a reference voltage signal and the programmed current signals through resistor 126 represents a reference current. With these references, the bus driver circuit can assert unusually tight control over the voltage and current signals placed on the bus. The messages contained in the trapezoidal reference signals get reflected on to the bus and transferred to other nodes. Yet, the reference signals at terminal F are unaffected by what happens on the bus because no feedback paths exist between the bus and nodes. Even without feedback paths, these references at terminal F permit automatic circuit reaction to undesirable disturbances on bus 18. By utilizing these references, the bus output waveforms remain stable and do meet the requirements of SAE J1850 without unusual oscillations, glitches or overshoots. The driver circuit produces the desired waveshaped, single-wire bus output over a wide range of bus load resistances, capacitances and inductances and during arbitration. Bus transient noise such as spikes also have less of an effect on the transmitted waveform messages during system operation.

AFFECTS OF BUS CURRENTS AND VOLTAGES

The amount of reference current through reference current resistor 126 and the amount that gets reflected into the output circuit of transistor 132 controls the amount of available current sourced to other nodes 4—4 of FIG. 1 connected to bus 18. Also, mismatches of voltage references, timing between nodes, and loss of arbitration affect the manner bus driver circuit 90 reacts to bus and voltage currents.

The number of nodes on the bus affect current demands of the bus driver circuit, still the references signals at terminal F remain unaffected. Current requirements for a single or a very small number of nodes minimizes the current demand. Adding nodes cause an increase in current demand.

Also, without affecting the reference signals at terminal F, if the voltage on bus 18 goes lower than the voltage amplitudes of the reference signal at terminal F, then bus driver 90 will source current signals representing the symbol messages appearing at terminal F. The current in the program current leg of the current mirror circuit 91 (i.e., current through resistor 120 and transistor 98) will reflect a mirrored current into the output leg (i.e., current through the output loop of transistor 116) and then through the output loop of output transistor 132 onto bus 18.

If the voltage on bus 18 exceeds the amplitude of the reference signal at terminal F, then the current in the input loop of transistor 132 will not sufficiently bias on transistor 132. Hence, transistor 132 will cutoff. Although not cutoff, an increase in input loop current of transistor 116 (about equal to about half the normal output loop current) will divert through the common base junctions of current mirror 91 and join a reduced mirrored current flowing through referenced diode connected transistor 98. The sum of these two currents (approximately equal to the normal output current of the current mirror) will then flow through the output loop of turned-on, current-programming transistor 96 through the referenced current resistor 126 to bus ground 19. This current diverting will continue until the reference voltage amplitude exceeds the voltage on the bus.

ARBITRATION

Figure 3A:
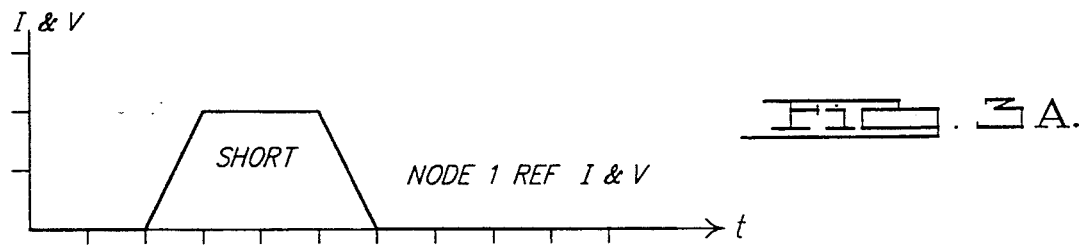
FIG. 3A–3F depicts signal arbitration using a series of waveform diagrams.
Figure 3B:
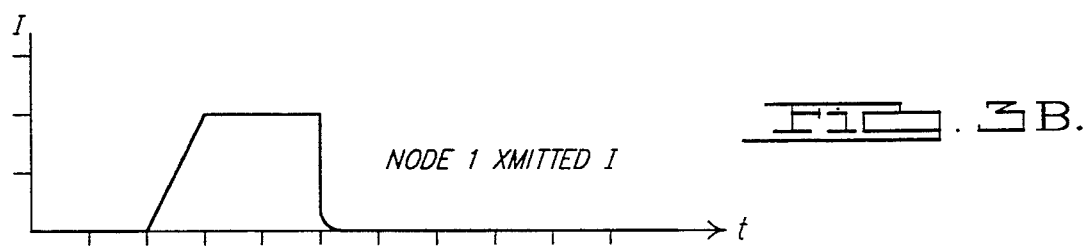
Figure 3C:
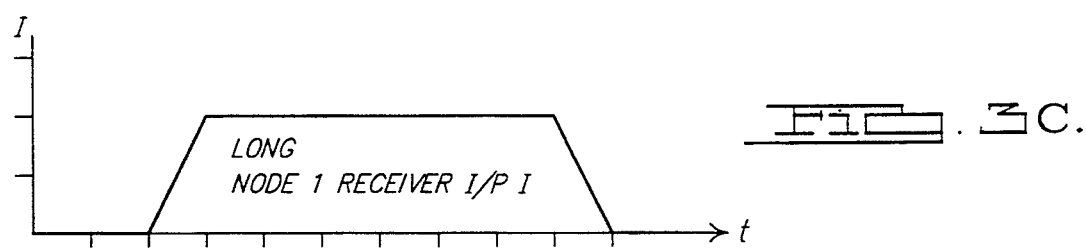
Figure 3D:
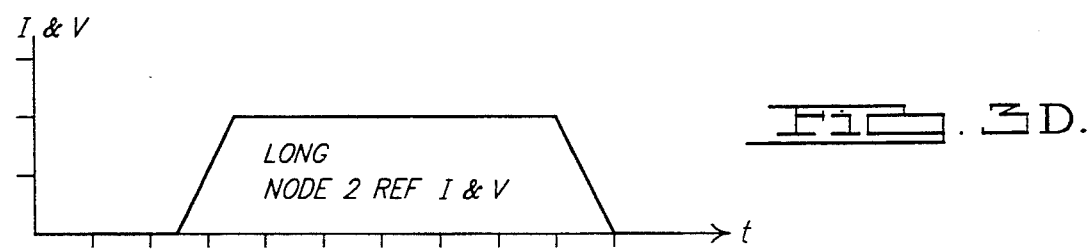
Figure 3E:
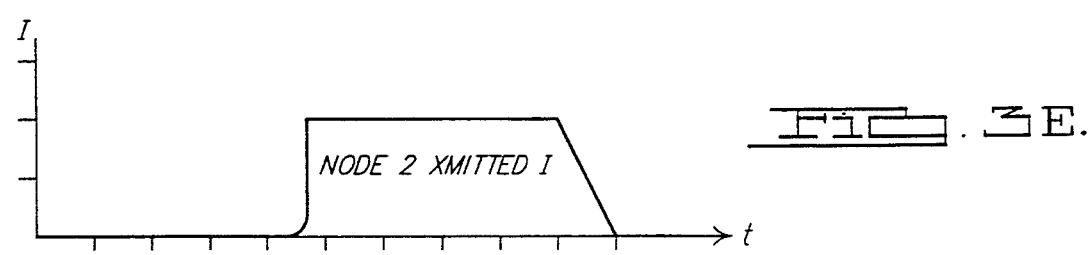
Figure 3F:
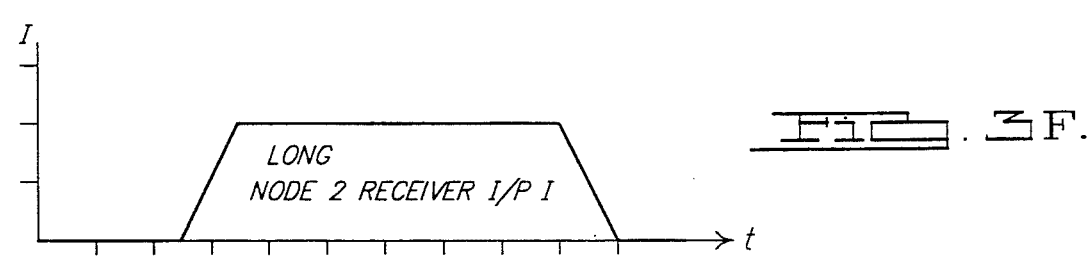

During arbitration, the receiver 20 plays a major part in whether a node wins or loses arbitration. To illustrate a typical example of arbitration, refer to FIGS. 3A-3F. Assume FIGS. 3A through 3C represent node 1 waveforms while FIGS. 3E through 3F represent Node 2 waveforms. FIG. 3A depicts the reference signal at terminal F of node 1 as a waveform carrying a short symbol while FIG. 3D depicts a reference signal at terminal F of node 2 as a waveform carrying a long symbol with the rising edge occurring slightly delayed with respect to rising edge of the waveform at node 1. As shown in FIGS. 3B and 3E, the current outputed from the bus driver circuit of node 1 will dominate the bus until the falling edge of the reference signal of node 1 occurs (see FIG. 3A). Since the receivers of both nodes 1 and 2 sense the waveform on the bus as carrying a long symbol rather than a short, the reference signal from node 2 causes the output current from node 2 to start to dominate over the current placed on the bus by the receding current which was sourced by node 1.

As shown in FIGS. 3B and 3E, almost immediately, node 1 ceases sourcing current to bus 18 and node 2 starts to provide bus current. Node 2 continues to source current until the long symbol gets transmitted to all the nodes listening to the signals on bus 18. Hence, node 2 wins the arbitration.

Under normal conditions, during arbitration, a node transmitting a high long symbol wins arbitration over another node transmitting a high short symbol. Likewise, a node transmitting a short, low symbol dominates over another node transmitting a long low symbol.

It is to be understood that the above-described embodiment mainly illustrates the principles of the present invention. Although a combination of discrete component/integrated circuit embodiment is disclosed, a combination integrated circuit/firmware/software equivalent could be developed. One skilled in the art may make changes; and modifications to the embodiment disclosed herein and may devise other embodiments without departing from the scope and essential characteristics thereof.

I claim:

1. A transceiver in nodes of a multiple node vehicle communications network having a communications bus prescribed for use in an automotive industrial standard data link, interconnecting the nodes, each node providing an input device for converting a chosen measurand into digital pulses appearing at varying rates in response to changes of the measurand into symmetrical, variable pulse width modulated (VPWM) trapezoidal shaped waveform signals, the waveform signals containing symbol information expressing the magnitudes of the measurand, each node containing a regulated power source connected to a vehicle battery to provide regulated logic voltages referenced with respect to a signal ground return; each node also containing a microcontroller (MCU) connected between the input device, power source and a symbol encoder decoder (SED), for receiving digital pulses from the input device representing magnitudes of the measurands, formatting the received digital pulses into digital messages, polling input and output ports connected to the SED, and initiating transmission over the bus via the SED, the SED being interconnected between the MCU and the transceiver for translating the digital messages from the MCU into said VPWM square-wave, line codings sent to other transceivers connected to the bus and for converting square wave digital signals received from other transceivers into digital messages used by the MCU for updating or controlling other peripherals associated with the network, said transceiver comprising:

(a) an integrator with an input for receiving the VPWM square-wave pulses from SED having pulse widths that define symbol information with respect to time and logic levels, and producing at an output terminal trapezoid type waveform signals with pulses 180 degrees out of phase with the square wave pulses and referenced with respect to a fixed voltage level;

(b) a waveshaper having an input for receiving the trapezoid waveform signals from the integrator and reshaping both corners at the extremities of each edge of the pulses over a chosen duration and then producing at an output terminal other trapezoid waveform signals in phase with the input waveform signals having the same pulse width as the input trapezoid signals at trip point voltages so as to retain the symbol information contained in the original square-wave signals, the reshaped trapezoid signals being referenced with respect to another fixed voltage level different from signal ground;

(c) a voltage-to-current converter having an input for receiving the reshaped trapezoid waveform signals from the waveshaper, and providing at an output a replica of the reshaped trapezoid waveform signals used as control current source signals, said control current source signals being routed to a current sensor circuit within the voltage-to-current converter to provide pulse voltage potentials with respect to signal ground return of magnitudes proportional to the voltage across the current sensor;

(d) a ground translation circuit including a current mirror circuit having an input connected to the current sensor circuit of the voltage-to-current converter so that the current in an input circuit corresponds with the current flowing through the current sensor of the voltage-to-current converter, the ground translation circuit having an output circuit connected to carry a reflected current of the same magnitude and direction as the current in the current mirror input circuit but the output current is referenced with respect to an independent bus ground return, the ground translation circuit also having an output reference voltage circuit used to establish a reference voltage signal referenced with respect to the independent ground return but which establishes voltage levels in response to varying current signals from the output circuit of the current mirror;

(d) a bus driver connected between the battery of the vehicle and the independent bus ground return, the bus driver comprising another current mirror circuit having an input circuit used to receive pulse signals from the reference voltage circuit of the ground translation circuit and for using the received pulse signals to program the current in an output circuit of the another current mirror, the programmed current causing a reflected current of an enhanced magnitude and of the same direction as the reference voltage and current to flow out of the output circuit of the another current mirror circuit, the bus driver having an output circuit connected between the output of the another current mirror and the bus for sourcing current onto the bus when the bus voltage levels permit transmitting and for cutting off the source current from the current mirror when the bus voltage levels inhibit transmitting; and (e) a receiver circuit interconnected between the bus and SED for receiving reshaped trapezoid waveform signals from the bus and extracting symbol information contained in the waveform signals and converting the extracted symbol information into digital pulse signals with pulse durations equivalent to the symbol information.

2. Apparatus as defined in claim 1 wherein the communications bus is a single wire bus.

3. Apparatus as defined in claim 1 wherein the symbol information remains constant in the reshaped trapezoid waveform signals received by each receiver in each transceiver despite the fact that the symbol information in the reshaped trapezoid pulses relates to the independent ground returns in each node and wherein the reference voltage and current in each node bring unaffected by the voltages and currents appearing on the single wire bus.

4. Apparatus as defined in claim 1 wherein the integrator includes circuits for lengthening the rise and fall times of the edges of the input square wave pulses, to produce symmetrical rise and fall time slopes about a chosen maximum pulse amplitude location, and wherein the amplitudes of the pulses being bounded at chosen voltage levels.

5. Apparatus as defined in claim 4 wherein the waveshaper provides gain and controlled gain reduction operations so as to further round the corners of the pulses at the extremities of each edge in forming the reshaped trapezoid pulses and wherein the provided gain produces bounding of the pulses at a chosen voltage amplitudes greater than the amplitudes of the bounded pulses from the integrator.

6. Apparatus as defined in claim 5 wherein the bus driver outputs pulses having amplitudes of a chosen multiple of the amplitude of the pulses across the sensor in the current-to-voltage converter and wherein the voltage and current related to the sensor are unaffected by the voltage and currents appearing on the bus and wherein the bus driver source pulses onto the bus in a non-feedback manner.

7. Apparatus as defined in claim 6 wherein the chosen multiple of the amplitude of the driver output pulses is about four times that of the amplitude of the output pulses from the current-to-voltage converter during transmissions.

8. Apparatus as defined in claim 7 wherein the output circuit of the bus driver and the input circuit of the receiver circuit of each node connect to a common point of the bus in a manner permitting effecting arbitration between nodes when more than one node attempts to gain control over transmitting messages over the bus.

9. A node transceiver of a multi-node network having a communications bus interconnecting the nodes permitting asynchronous communication between nodes providing to the network information from an input device such as sensors and switches, each node connected to the bus having (1) a regulated power source connected to a fixed voltage to provide regulated logic voltages referenced with respect to a signal ground return, (2) a microcontroller (MCU) connected between the input devices associated with the node, a symbol encoder decoder (SED) and the regulated power source, for receiving signals from the input device representing magnitudes of a measurand, formatting the received signals into digital messages, polling input and output ports connected to the SED, and initiating transmissions over the bus by controlling the operations of SED, and (3) the SED interconnected between the MCU and the transceiver for translating the digital messages from the MCU into variable pulse width modulated (VPWM) square-wave signals sent to other transceivers connected to the bus and for converting the square-wave digital signals received from other transceivers into digital messages used by the MCU for updating or controlling other peripherals associated with the network, said transceiver comprising:

a. integrating means for converting the VPWM square-wave signals received from SED into a decreased amplitude, 180 degrees out-of-phase trapezoid waveform signals referenced with respect to bounding fixed voltage levels, the trapezoid waveform signals having consistent pulse widths at chosen trigger points which continues to define the symbol information placed in the original square-wave pulses;

b. waveshaper means coupled to the integrator means for intercepting and then reshaping the corners at the extremities of each edge of the pulses of the trapezoid waveform signals, and providing gain and controlled gain reduction parameters, yet retaining the consistent pulse width at the trigger points of the pulses;

c. voltage-to-current converter means for using the reshaped trapezoidal waveform signals to provide varying control current source signals with respect to signal ground return in response to changes in amplitude and duration of the reshaped trapezoid waveform pulse signals;

d. a ground translation means connected in an output loop of the voltage-to-current converter for transferring the reference of the varying control current source signals formed in the voltage-to-current converter from the signal ground return to the independent bus ground return, and for using the converted current to establish a varying reference voltage levels used for controlling sourcing current onto the bus during node transmissions, the varying reference voltage levels being unaffected by changes in current and voltages on the bus.

e. bus driver means responsive to the varying reference voltage levels for proving amplified reshaped pulse signals which route to the bus providing symbol messages on the bus that minimizes electromagnetic interference in the vehicle if the bus voltage levels remain below the reference voltage levels of the translation circuit, the bus driver 10. Apparatus as defined in claim 9 wherein the receiver circuit and the bus driver means of each node connect to a common point of the bus in a manner that permit achieving arbitration between nodes attempting to gain control over the bus in order to transmit, the arbitration taking place substantially at the same time when the competing nodes are attempting to transmit messages.

11. Apparatus as defined in claim 10 wherein the voltages and current levels appearing on the bus may be affected by a mismatch of reference voltages in the various nodes connected to the bus and a timing mismatch of the current sourced on the bus by the bus driver circuits and received by the receivers and a loss of arbitration of competing nodes.

12. Apparatus as defined in claim 11 wherein the receiver circuit in each node contains ground translation circuits for changing the references of the received signals from the bus ground return to the signal ground return.

* * * * *